US007242558B2

United States Patent
Chen

(10) Patent No.: US 7,242,558 B2
(45) Date of Patent: Jul. 10, 2007

(54) ESD PROTECTION MODULE TRIGGERED BY BJT PUNCH-THROUGH

(75) Inventor: Chung-Hui Chen, Hsin-Chu (TW)

(73) Assignee: Taiwan Semiconductor Co., Ltd., Hsin-Chu (TW)

( * ) Notice: Subject to any disclaimer, the term of this patent is extended or adjusted under 35 U.S.C. 154(b) by 459 days.

(21) Appl. No.: 10/858,798

(22) Filed: Jun. 1, 2004

(65) Prior Publication Data

US 2005/0264968 A1    Dec. 1, 2005

(51) Int. Cl.
    *H02H 9/04* (2006.01)
(52) U.S. Cl. ...................................... 361/56
(58) Field of Classification Search .............. 361/56, 361/111, 91.1
    See application file for complete search history.

(56) References Cited

U.S. PATENT DOCUMENTS

| | | | |
|---|---|---|---|
| 5,413,969 A | 5/1995 | Huang | 437/200 |
| 5,946,573 A | 8/1999 | Hsu | 438/275 |
| 6,096,609 A | 8/2000 | Kim et al. | 438/281 |
| 6,479,870 B1 | 11/2002 | Chen et al. | 257/355 |
| 6,646,840 B1 * | 11/2003 | Sugerman et al. | 361/56 |
| 6,867,957 B1 * | 3/2005 | Tong et al. | 361/56 |
| 6,903,913 B2 * | 6/2005 | Ker et al. | 361/111 |
| 6,954,098 B2 * | 10/2005 | Hsu et al. | 327/313 |

* cited by examiner

*Primary Examiner*—Stephen W. Jackson
*Assistant Examiner*—Boris Benenson

(57) ABSTRACT

An electrostatic discharge protection (ESD) circuit is disclosed for protecting a pad of an integrated circuit from ESD events. The ESD circuit has an ESD trigger module having a first and second transistors connected in series, between the pad and a first common node, at least one ESD protection module having a third and fourth transistors connected in series between the pad and a second common node, and a current limiting resistor in the ESD trigger module connected between the first and second common nodes, wherein the first and second transistors have a shorter channel length than that of the third and fourth transistors so that the ESD trigger module is turned on before the ESD protection module when an ESD event happens on the pad.

21 Claims, 6 Drawing Sheets

ESD PROTECTION MODULE TRIGGERED BY BJT PUNCH-THROUGH

BACKGROUND

The present disclosure relates generally to integrated circuit (IC) design, and more particularly, to a method for protecting the core circuitry of an integrated circuit (IC) from damage that may be caused by electrostatic discharge (ESD).

A gate oxide of any metal-oxide-semiconductor (MOS) transistor, in an integrated circuit, is most susceptible to damage. The gate oxide may be destroyed by being contacted with a voltage only a few volts higher than supply voltage. It is understood that a regular supply voltage is 5.0, 3.3, 3.1 volts, or lower. Electrostatic voltages from common environmental sources can easily reach thousands, or even tens of thousands of volts. Such voltages are destructive even though the charge and any resulting current, are extremely small. So, it is of critical importance to discharge any static electric charge, as it builds up, before it accumulates to a damaging voltage.

ESD is only a concern to an integrated circuit before it is installed into larger circuit assemblies, such as a printed circuit board (PCB), and before the PCB is connected to an operating power. This susceptible period includes production, storage, transport, handling, and installation. After the power is supplied, the power supplies and the structures can easily absorb or dissipate electrostatic charges.

ESD protection module is typically added to ICs at the bond pads. The pads are the connections to the IC, to or from outside circuitry, for all electric power supplies, electric grounds, and electronic signals. Such added circuitry must allow normal operation of the IC. That means that the protection module is effectively isolated from the normally operating core circuitry because it blocks current flow through itself, to ground, or any other circuit, or pad. In an operating IC, electric power is supplied to a VCC pad, electric ground is supplied to a VSS pad, electronic signals are supplied from outside to some pads, and electronic signals generated by the core circuitry of the IC are supplied to other pads for delivery to external circuits and devices. In an isolated, unconnected IC, all pads are considered to be electrically floating, or of indeterminant voltage. In most cases, that means that the pads are at ground, or zero voltage.

ESD can arrive at any pad. This can happen, for example, when a person touches some of the pads on the IC. This is the same static electricity that may be painfully experienced by a person who walks across a carpet on a dry day, and then touches a grounded metal object. In an isolated IC, ESD acts as a brief power supply for one or more pads, while the other pads remain floating, or grounded. Because the other pads are grounded, when ESD acts as a power supply, at a randomly selected pad, the protection module acts differently than it does when the IC is operating normally. When an ESD event occurs, the protection module must quickly become current conductive, so that the electrostatic charge is conducted to VSS ground and thus, dissipated before damaging voltage builds up.

ESD protection module, therefore, has two states. In a normally operating IC, ESD protection module appears invisible to the IC by blocking current through itself and thus, having no effect on the IC. In an isolated, unconnected IC, ESD protection module serves its purpose of protecting the IC by conducting an electrostatic charge quickly to VSS ground before a damaging voltage can build up.

Salicide is used widely in deep submicron CMOS technology in lowering the sheet resistance of poly resistors and the source or drain regions. In a typical ESD protection module design, a pad is connectable to an NMOS transistor which may also be connected, in parallel, with a parasitic BJT device. Each such circuit is referred to as a "finger" and many such fingers can be connected, in parallel, to dissipate the ESD current. However, full salicide CMOS technology, without using a "salicide-blocked" process, that includes salicide blocking and salicide removing steps, in an NMOS source/drain region, seriously jeopardize the performance of the ESD protection module. The non-uniform turn-on behaviors between ESD protection modules, or fingers, and the filament and thermal runaway, at the MOS channel, of the NMOS transistor, are the causes for such poor ESD performance. Since adding a ballast resistor between the pad and the drain of the NMOS transistor can help the BJTs, in different fingers, to turn on uniformly, removing the salicide on the drain of the NMOS transistor can create such a ballast resistor, thus, helping the uniform turn-on of the parasitic BJTs in different fingers.

Another previous proposed method called multi-finger turn-on (MFT) technique has to insert salicide poly resistors between the source region of the NMOS transistor and the ground to make sure all the fingers will be triggered in the ESD event. However, inserting a resistor like that may cause other issues. For example, the sheet resistance of the salicide poly resistor may be deviated after an ESD event has happened, thereby, deviating the drivers' I-V curve after ESD stressing.

As the technology advances, high voltage tolerant ESD design is often adopted on various high voltage tolerant (HVT) applications. What is increasingly in need is an improved ESD protection module.

SUMMARY

In view of the foregoing, this disclosure provides an electrostatic discharge (ESD) protection device, and the method for operating the same. In one example, the ESD protection device, for each pad of an integrated circuit, includes a first trigger module connected to a first pad, and a first protection module connected to the first pad, wherein the first trigger module includes a first parasitic bipolar junction transistor, and the first protection module includes a second parasitic bipolar junction transistor. During an ESD event, the first parasitic bipolar junction transistor punches through, thereby turning on the second bipolar transistor.

In another example, the protection module for each pad of an integrated circuit includes a trigger module connected to a first pad, and a plurality of ESD protection modules connected to the first pad, wherein the trigger module simultaneously triggers the plurality of the ESD protection modules, each of which dissipates ESD charge therethrough.

Various aspects and advantages will become apparent from the following detailed description, taken in conjunction with the accompanying drawings, illustrating the principles of the disclosure by way of examples.

DESCRIPTION

The present disclosure provides an improved method for electrostatic discharge (ESD) protection. The improved design provides a high ESD durability feature without salicide blocking. Moreover, the improved design can tolerate high voltage stress so that it can be used for high voltage input/output pins. As will be shown in more detail below, the improved design uses a cascaded transistor set with a relatively short channel length as "ESD trigger device" to trigger another cascaded transistor set with longer channel lengths.

Figure 1:
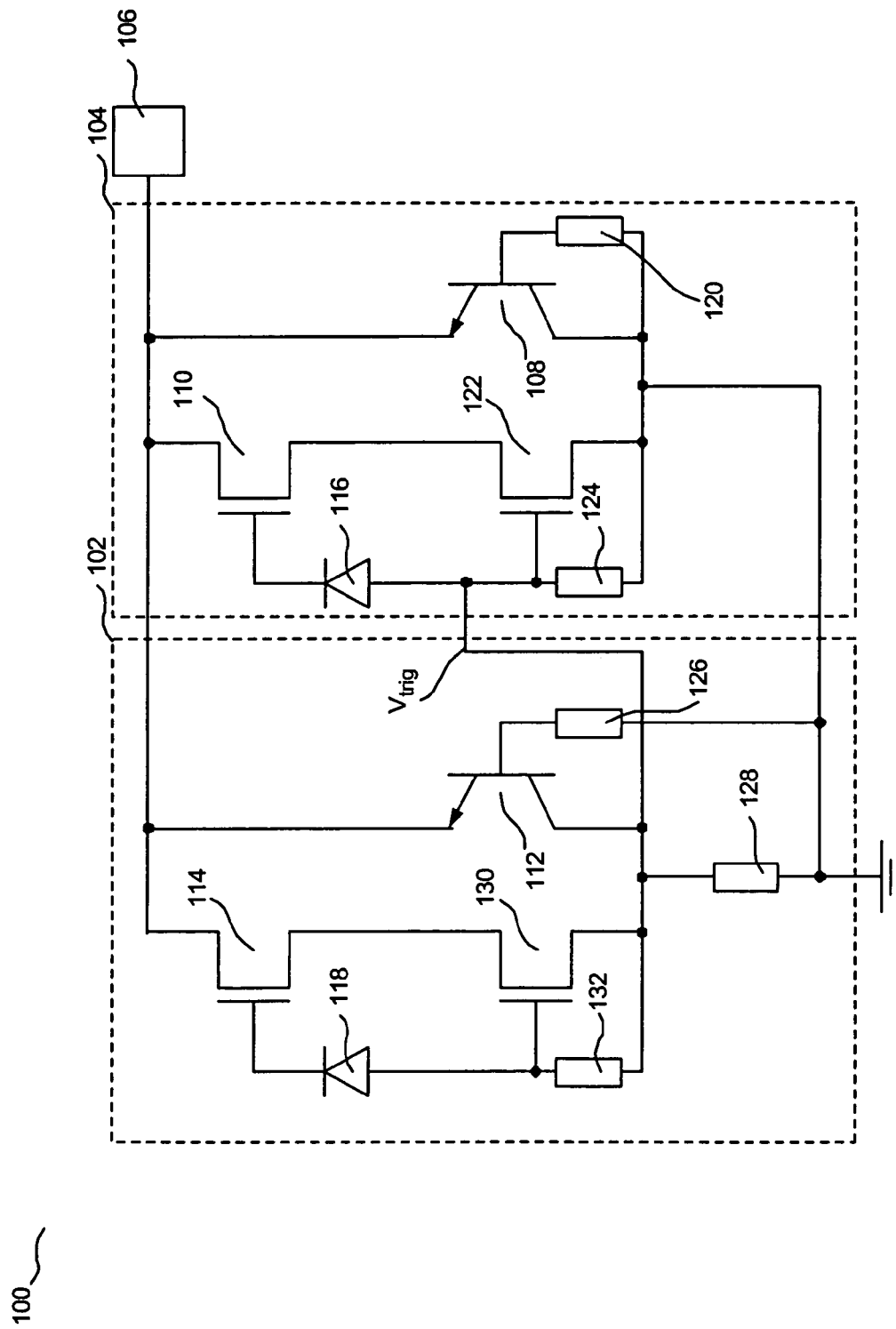
FIG. 1 illustrates a protection device, in accordance with a first example of the present disclosure.

In a first example, FIG. 1 illustrates an ESD protection device 100 with an ESD trigger module 102, and an ESD protection module 104. Although only one protection module 104 is shown, a plurality of such "fingers" can be duplicated to be connected, in the same manner, as module 104 to any pad, on an as-needed basis. Bondpad, or pad 106, in operation, may be a pad for a power supply, an external electronic input signal source, or an internal electronic output signal source. Pad 106 is connected to the emitter of a parasitic n-p-n bipolar junction transistor (BJT) 108, to the drain of N-channel metal-oxide-semiconductor field-effect-transistor (NMOSFET) 110, to the emitter of n-p-n BJT 112, and to the drain of NMOSFET 114. VSS is connected to resistor 120, to the collector of BJT 108, to the source of NMOSFET 122, to the resistor 124, to the resistor 126, and to the resistor 128. Resistor 120 is also connected to the base of BJT 108. Resistor 124 is also connected to the gate of NMOSFET 122, the anode of diode 116, the collector of BJT 112, resistor 128, the source of NMOSFET 130, and the resistor 132. Resistor 126 is also connected to the base of BJT 112. Further, resistor 132 is connected to the gate of NMOSFET 130, and the anode of diode 118. The drain of NMOSFET 122 is connected to the source of NMOSFET 110. The cathode of diode 116 is connected to the gate of NMOSFET 110. The cathode of diode 118 is connected to the gate of NMOSFET 114. The drain of NMOSFET 130 is connected to the source of NMOSFET 114. As it can be seen, the ESD trigger module has similar internal structure, as a regular ESD protection module, except that the transistors 114 and 130 have a shorter channel length than transistors 110 and 122. The parasitic BJTs and resistors 120 and 126, are there inherently as the NMOSFETs are formed in a substrate. In one example, the base width of BJT 112 is made bigger than the base width of BJT 108, so that the thermal breakdown voltage of BJT 112 is smaller than that of BJT 108.

In a normal operation of the IC, both the ESD trigger module 102, and the ESD protection module 104 must remain inert, and have no effect on the operation of the core circuitry. The pad voltage normally varies in a range between VDD and VSS. Therefore, punch-through does not occur, and the ESD trigger module does not turn itself on, and it does not act to trigger the ESD protection module to turn on. Therefore, NMOSFET 130 and NMOSFET 122 remain off, and no current flows through them between the pad and VSS.

An IC is susceptible to ESD damage before it is installed into a larger circuit assembly, such as a printed circuit board (PCB), and before the PCB is connected to operating power. This susceptible period includes production, storage, transport, handling and installation. ESD protective circuitry is connected to each pad. In an isolated, unconnected IC, all pads are considered to be at VSS, or to be floating. When a positive ESD arrives at any pad such as pad 106, the ESD acts as a power supply applying positive voltage to that pad.

Since the cascaded NMOSFETs 114 and 130 have a shorter channel length than that of the cascaded NMOSFETs 110 and 122, a lower punch-through voltage is needed in the ESD trigger module than the ESD protection module 104. When a positive ESD event occurs, BJT 112, in the ESD trigger module 102, will have a punch-through, while BJT 108, in the ESD protection module 104, may not. When this occurs, a hole current is injected into the body, P-well, which is also the base of the parasitic BJT 112. BJT 112, in the ESD trigger module, will then turn on faster than BJT 108, in the ESD protection module.

When BJT 112 turns on, current flows through resistor 128, which produces a voltage $V_{trig}$ that is above VSS, at the source of NMOSFET 130 and at the gate of NMOSFET 122. The resistor 128 protects the NMOSFET 130 and the NMOSFET 114 by limiting the current flows therethrough. As such, the transistors will not be overstressed before the protection module is turned on. The base current of BJT 112 flows through resistor 126, which produces a different voltage at the P-well. The rise in the voltage, at the gate of NMOSFET 122 turns it on before any bipolar effects occur. Resistor 126 is the P-well tie-down resistance for BJT 112 and resistor 120 is the tie-down resistance for BJT 108. When NMOSFET 114 punches through and then breaks down, hole current will be injected into its P-well, thereby turning on BJT 112. Resistor 126 is designed such that it has a higher resistance than resistor 120, thereby ensuring that BJT 112 turns on before BJT 108 does, since P-well voltages at BJTs 112 and 108 are equivalent to the whole current times the resistance of resistors 126 and 120, respectively.

The use of this ESD trigger module 102 turns on all the ESD fingers simultaneously, and the ESD trigger module 102 only conducts a limited amount of current because the MOS gating is weak, and the current is further limited by the resistor 128. The ESD protection module 104, however, while being turned on a little later, dissipates a much larger ESD current therethrough since multiple ESD fingers can simultaneously conduct. Since all the ESD fingers are gated on simultaneously, a salicide blocking process step is not required to balance the current among the ESD fingers.

Figure 2:
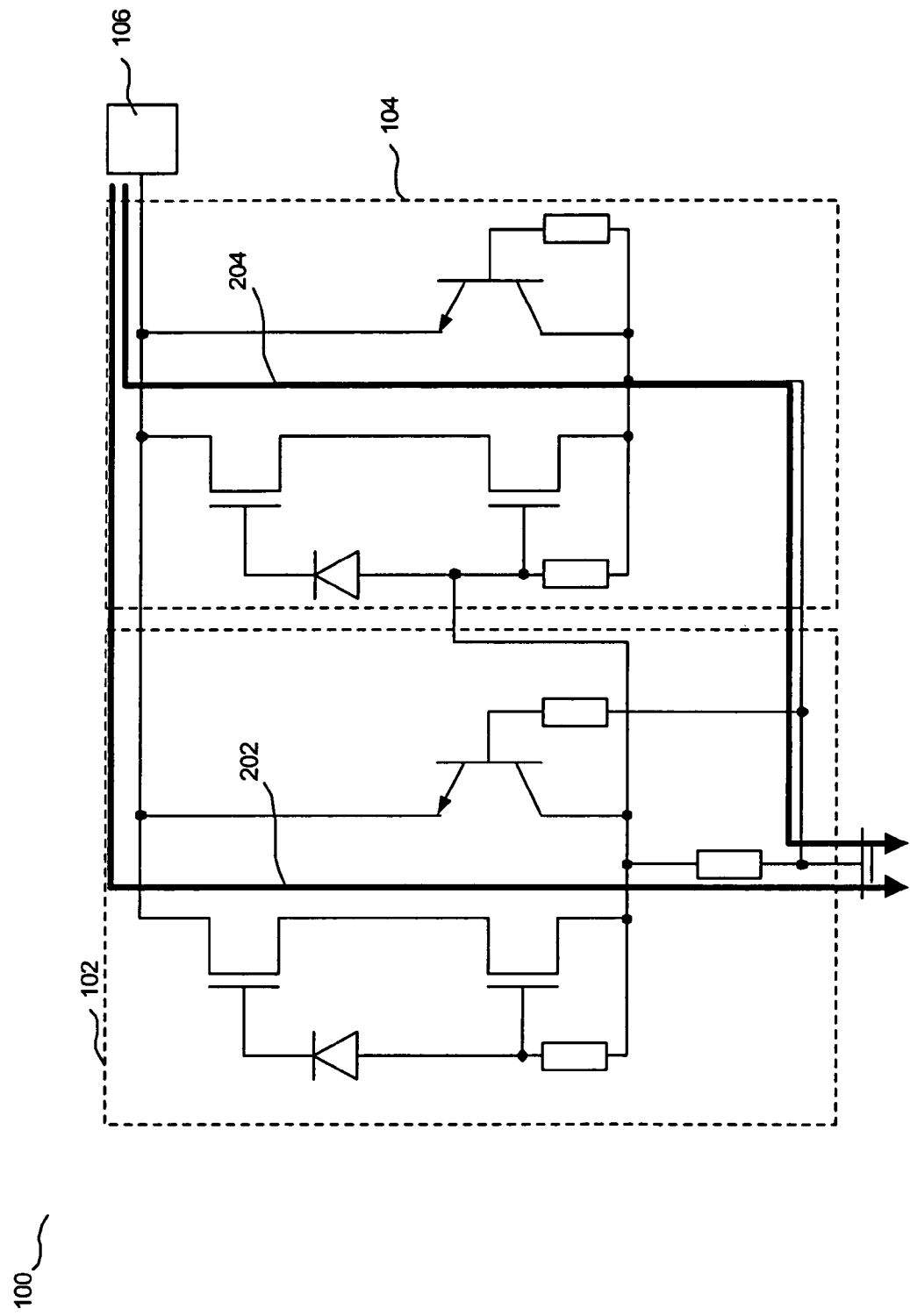
FIG. 2 illustrates an example of current pathway during a positive electrostatic discharge event, in accordance with the first example of the present disclosure.

FIG. 2 illustrates two ESD pathways 202 and 204 going through the protection device 100. When a positive ESD charge arrives at the pad 106, a minor portion of the ESD current passes through one ESD pathway 202, on which the ESD trigger module 102 resides, to VSS. The major portion of the ESD current passes through another ESD pathway 204, on which the ESD protection module 104 resides, to VSS.

Figure 3:
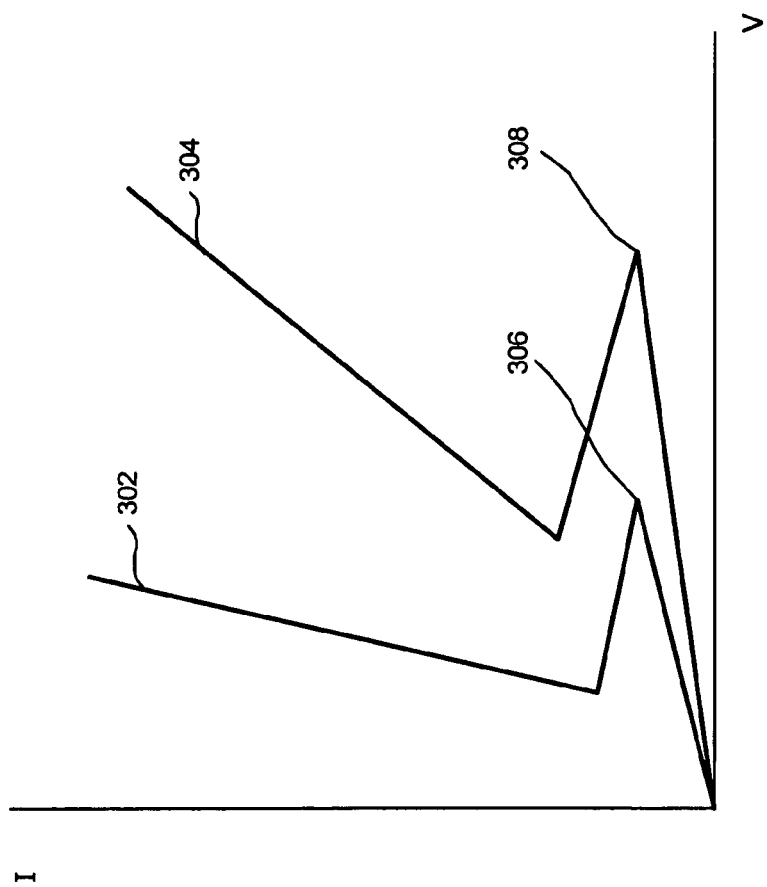
FIG. 3 illustrates a current-voltage graph, in accordance with the first example of the present disclosure.

In FIG. 3, a current/voltage graph 300 illustrates the characteristics of the protection device 100. A curve 302 represents the current/voltage relationship of the ESD trigger module 102, while a curve 304 represents the current/voltage relationship of the ESD protection module 104. A breakdown voltage of the ESD trigger module 102, as represented by 306, is much lower than the breakdown voltage of the ESD protection module 104, as represented by 308 due to the shorter channel length.

Figure 4:
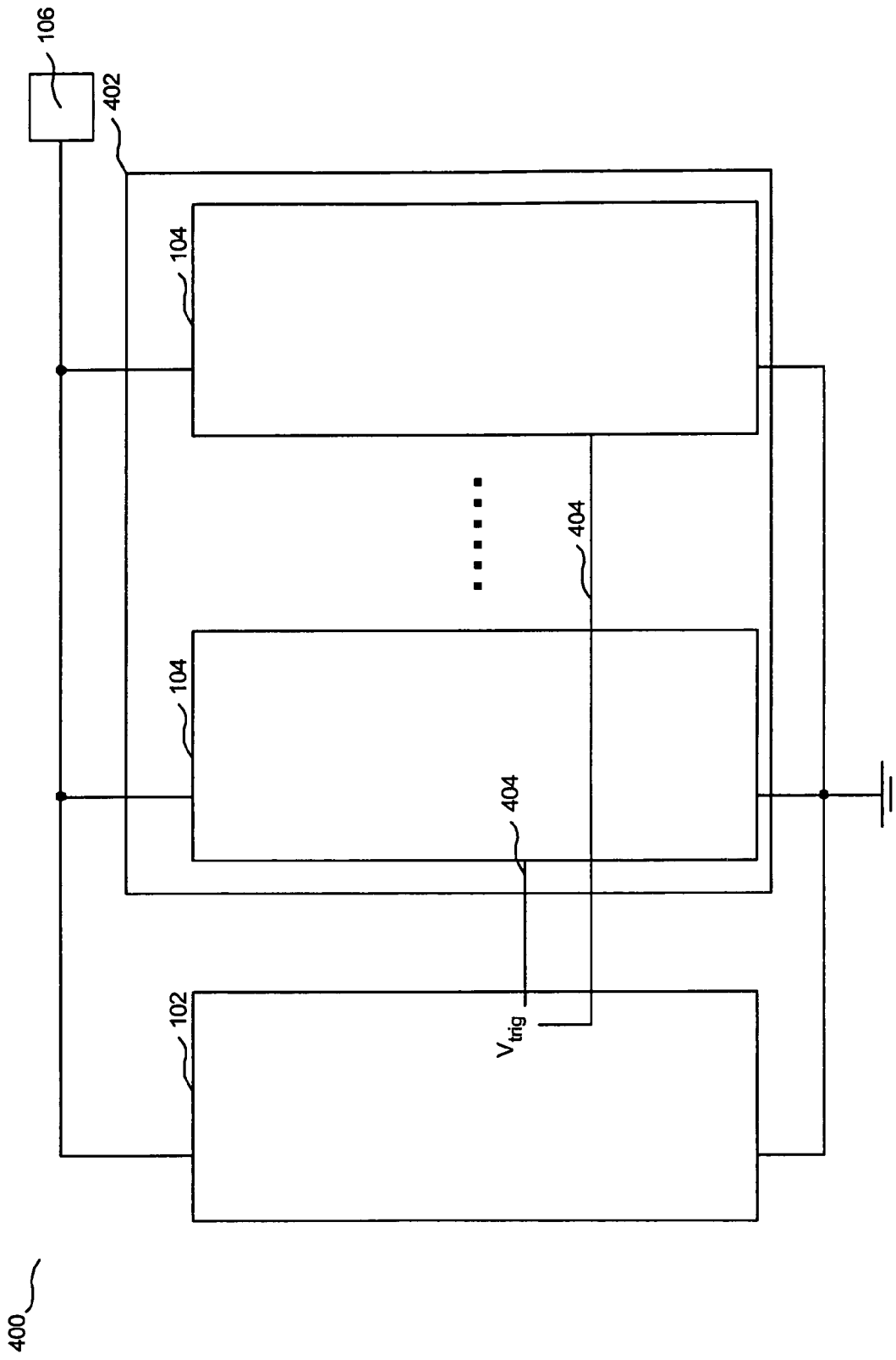
FIG. 4 illustrates a protection device, in accordance with a second example of the present disclosure.

FIG. 4 illustrates a second example of the present disclosure. A protection device 400 includes the ESD trigger module 102, pad 106 and an ESD protection finger module 402, which, in turn, includes a plurality of ESD protection modules 104. The number of ESD protection modules 104 depends on design and targeted on-resistance.

The ESD trigger module 102 and each protection module 104 of the finger module 402 are connected to pad 106 and VSS. As illustrated with regard to FIG. 1, through a plurality of parallel connections 404 that carry $V_{trig}$, the ESD trigger module 102 simultaneously trigger a plurality of the protection modules 104 or fingers of the ESD protection finger module 402. The net effect is such that the resistance for the protection device 400 becomes very small when it is turned on, thereby allowing fast ESD charge dissipation without simultaneous build-up of ESD voltage.

Figure 5:
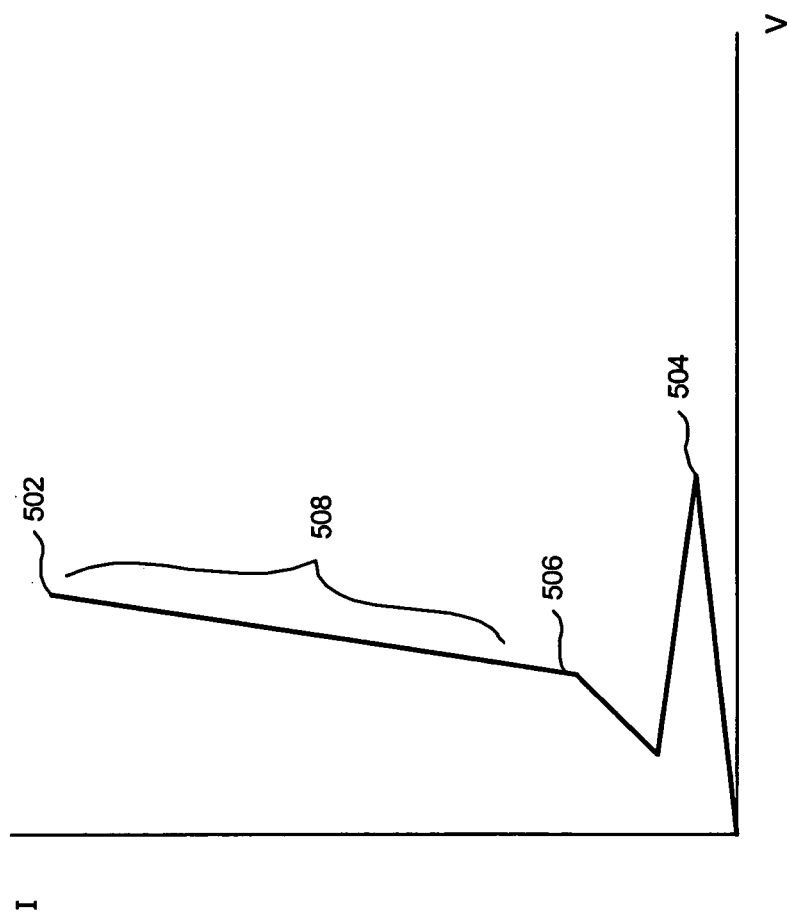
FIG. 5 illustrates a current-voltage graph, in accordance with the second example of the present disclosure.

In FIG. 5, a current/voltage graph 500 illustrates the characteristics of the protection device 400. A curve 502 represents the current/voltage relationship of the protection device 400. Both NMOSFETs 114 and 130 in the ESD trigger module are triggered at a point 504, and when the NMOSFETs 122 of all the ESD protection modules 104 are turned on, as represented at point 506, ESD charge starts dissipating. When all the NMOSFETs of all ESD protection modules are turned on, as represented by 508, the resistance becomes very small, thereby allowing fast ESD charge dissipation.

Figure 6:
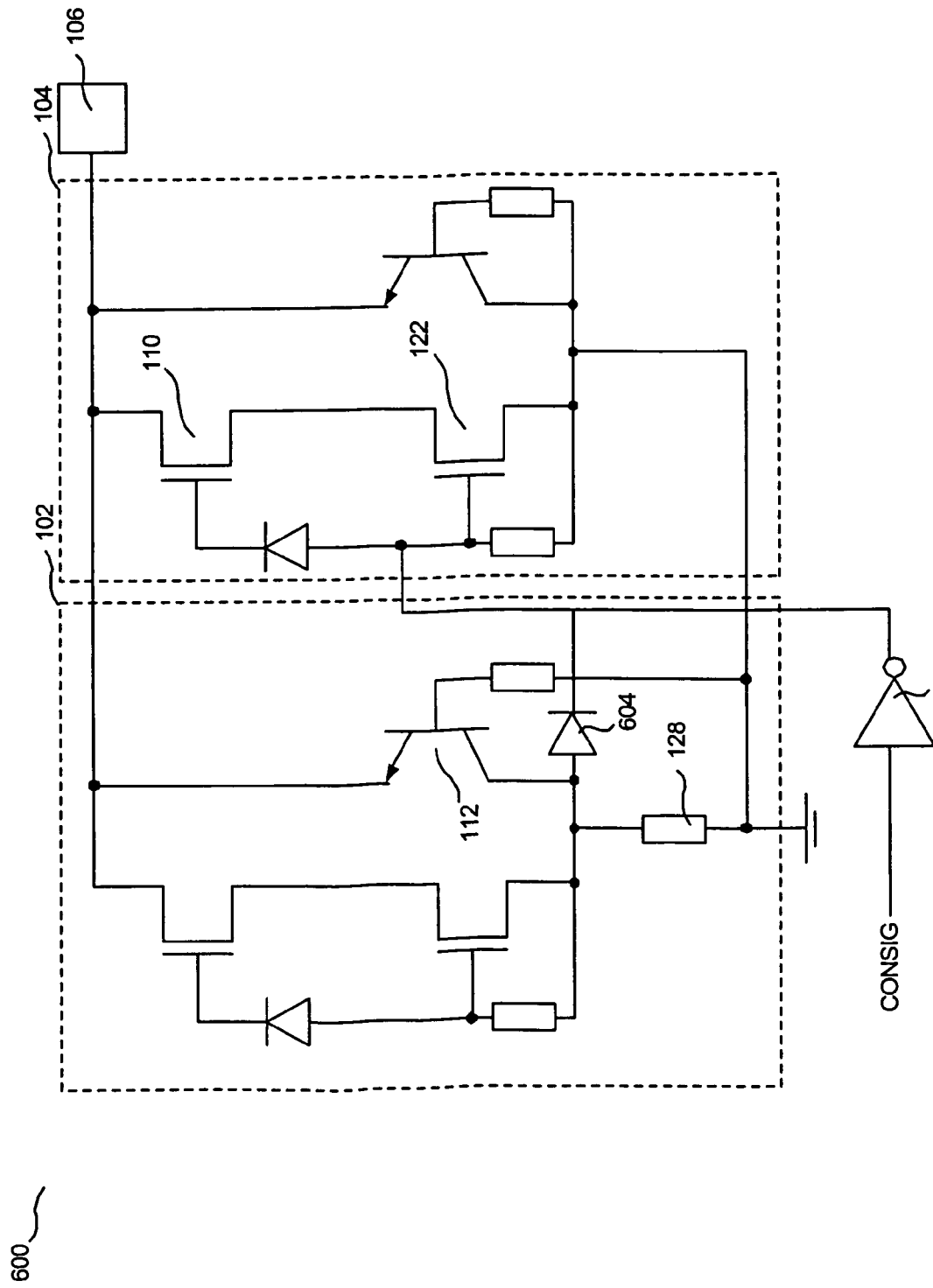
FIG. 6 illustrates a dual-purpose protection device, in accordance with a third example of the present disclosure.

FIG. 6 illustrates a dual-purpose protection device 600, acting both as an ESD dissipation device, and a load control device, or a driver. A control signal CONSIG drives an inverter 602, whose output arrives at the gate of NMOSFET 122 as if it is $V_{trig}$, or the output of the ESD trigger module 102. As an example, if the control signal CONSIG is low, $V_{trig}$ is high, thereby switching both NMOSFETs 110 and 122 on. Therefore, by connecting a power supply, and a load device, in series to pad 106, the combination of the inverter 602 and the NMOSFETs 110 and 122 can be viewed as a switch, switching on or off depending on the status of the control signal CONSIG. This switch is ideal for load devices that carry a high current. It is understood by those skilled in the art that the inverter 602 may be replaced by other circuit elements to cater to other purposes of the load control device, and that these other circuit elements may, from time to time, be connected externally, or constructed internally in the IC. A diode 604 with its cathode connected to the output of the inverter, and the gate of NMOSFET 122 is installed to prevent the control signal from affecting the ESD trigger module 102.

During an ESD event, BJT 112 will punch through, thereby turning on NMOSFETs 110 and 124, which, in turn, dissipates ESD charge to VSS as previously described. The presence of the diode 604 will not affect ESD protection since it only prevents a signal from going into the ESD trigger module 102 but does not prohibit a signal from going out of the ESD trigger module 102 and into the ESD protection module 104. It is also understood by those skilled in the art that the third example may, from time to time, also be extended to include a plurality of ESD protection modules 104 connected in parallel, wherein all ESD protection modules 104 are triggered simultaneously by the MOS gates to conduct a large current for a driver circuit.

The above disclosure provides many different embodiments, or examples, for implementing different features of the disclosure. Specific examples of components, and processes are described to help clarify the disclosure. These are, of course, merely examples, and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly, and in a manner consistent with the scope of the disclosure, as set forth in the following claims.

What is claimed is:

1. An electrostatic discharge protection (ESD) circuit for a pad of an integrated circuit, the ESD circuit comprising:
   an ESD trigger module having a first and second transistors and a first parasitic bipolar transistor (BJT), wherein the first and second transistors are connected in series between the pad and a first common node and a collector of the first BJT is coupled to the first common node;
   at least one ESD protection module having a third and fourth transistors connected in series between the pad and a second common node;
   a current limiting resistor in the ESD trigger module connected between the first and second common node,
   wherein the first and second transistors have a shorter channel length than that of the third and fourth transistors so that the ESD trigger module is tuned on before the ESD protection module when an ESD event happens on the pad.

2. The circuit of claim 1 wherein a first resistance between a base of the first parasitic bipolar transistor (BJT) parallel to the first and second transistors, and the second common node is larger than a second resistance between a base of a second parasitic BJT parallel to the third and fourth transistors and the second common node.

3. The circuit of claim 2 wherein a base width of the first BJT is shorter than that of the second BJT so that a thermal breakdown voltage of the first BJT is smaller than that of the second BJT.

4. An electrostatic discharge protection (ESD) circuit for a pad of an integrated circuit, the ESD circuit comprising:
   an ESD trigger module having a first and second transistors connected in series between the pad and a first common node:
   at least one ESD protection module having a third and fourth transistors connected in series between the pad and a second common node; and
   a current limiting resistor in the ESD trigger module connected between the first and second common node.
   wherein the first and second transistors have a shorter channel length than that of the third and fourth transistors so that the ESD trigger module is turned on before the ESD protection module when an ESD event happens on the pad, and
   wherein the ESD trigger module further includes a first resistor connected between the first common node and the gate of the second transistor and a first diode with its anode connecting the gate of the second transistor and its cathode connecting the gate of the first transistor, and, wherein, the ESD protection module further includes a second resistor connected between the gate of the fourth transistor, and the second common node, and a second diode with its anode connecting the gate of the fourth transistor, and its cathode connecting the gate of the third transistor.

5. The circuit of claim 4 wherein the first common node connects to the gate of the fourth transistor.

6. The circuit of claim 4 wherein the current limiting resistor is larger than the second resistor.

7. An electrostatic discharge protection (ESD) circuit for a pad of an integrated circuit, the ESD circuit comprising:

an ESD trigger module comprising:
   a first and second NMOS transistors connected in series between the pad and a first common node with the first transistor's drain connecting to the pad;
   a first resistor connected between the first common node and the gate of the second transistor;
   a current limiting resistor connected between the first and a second common node;
one or more ESD protection modules each comprising:
   a third and fourth NMOS transistors connected in series, between the pad and the second common node, with the third transistor's drain connecting to the pad; and
   a second resistor connected between the gate of the fourth transistor and the second common node,
wherein the first common node connects to the gate of the fourth transistor, and
wherein the first and second transistors have a shorter channel length than that of the third and fourth transistors, so that the ESD trigger module is turned on before the ESD protection modules, when an ESD event happens on the pad and then simultaneously turns on the ESD protection modules.

8. The circuit of claim 7 wherein a first resistance between a base of a first parasitic bipolar transistor (BJT) parallel to the first and second transistors, and the second common node, is larger than a second resistance between a base of a second parasitic BJT parallel to the third and fourth transistors and the second common node.

9. The circuit of claim 8 wherein a thermal breakdown voltage of the first BJT is smaller than that of the second BJT.

10. An electrostatic discharge protection (ESD) circuit for a pad of an integrated circuit, the ESD circuit comprising:
an ESD trigger module comprising:
   a first and second NMOS transistors connected in series between the pad and a first common node with the first transistor's drain connecting to the pad;
   a first resistor connected between the first common node and the gate of the second transistor: and
   a current limiting resistor connected between the first and a second common node: and
one or more ESD protection modules each comprising:
   a third and fourth NMOS transistors connected in series, between the pad and the second common node, with the third transistor's drain connecting to the pad; and
   a second resistor connected between the gate of the fourth transistor and the second common node,
wherein the first common node connects to the gate of the fourth transistor,
wherein the first and second transistors have a shorter channel length than that of the third and fourth transistors, so that the ESD trigger module is turned on before the ESD protection modules, when an ESD event happens on the pad and then simultaneously turns on the ESD protection modules, and
wherein the ESD trigger module further includes a first diode with its anode connecting the gate of the second transistor, and its cathode connecting the gate of the first transistor.

11. The circuit of claim 10 wherein each ESD protection module further includes a second diode with its anode connecting the gate of the fourth transistor, and its cathode connecting the gate of the third transistor.

12. The circuit of claim 7 wherein the current limiting resistor is larger than the second resistor so that the second transistor is not overstressed before the ESD protection module is turned on.

13. The circuit of claim 7 further comprising a driver module connected to the first common node to make the ESD protection module to function as a driver circuit.

14. The circuit of claim 13 further comprising a diode in the ESD trigger module, with its anode connected to the first common node, and anode connected to the gate of the fourth transistor.

15. The circuit of claim 7 wherein the second common node is connected to ground.

16. A method for dissipating an electrostatic charge on a pad of an integrated circuit, the method comprising:
   turning on an electrostatic discharge (ESD) trigger module when the electrostatic charge arrives on the pad, the ESD trigger module having a first and second NMOS transistors connected in series, between the pad, and a first common node with the first transistor's drain connecting to the pad, a first resistor connected between the first common node and the gate of the second transistor, and a current limiting resistor connected between the first and a second common node;
   simultaneously turning on one or more ESD protection modules, which comprises third and fourth NMOS transistors connected in series, by feeding a current through the first common node to a gate of the fourth transistor, wherein the third and fourth NMOS transistors are configured, between the pad and the second common node with the third transistor's drain connecting to the pad, and a second resistor connected between the gate of the fourth transistor and the second common node,
   wherein the first and second transistors have a shorter channel length than that of the third and fourth transistors so that the ESD trigger module is turned on before the ESD protection modules when the electrostatic charge arrives on the pad and then simultaneously turns on the ESD protection modules.

17. The method of claim 16 wherein a first resistance between a base of a first parasitic bipolar transistor (BJT) parallel to the first and second transistors and the second common node is larger than a second resistance between a base of a second parasitic BJT parallel to the third and fourth transistors and the second common node.

18. The method of claim 16 wherein a thermal breakdown voltage of the first BJT is smaller than that of the second BJT.

19. The method of claim 16 wherein the turning on of an electrostatic discharge trigger module further includes turning on the second transistor and feeding a current through a first diode to turn on the first transistor.

20. The method of claim 16 wherein the turning on of the ESD protection modules further includes turning on the fourth transistor and feeding a current through a second diode to turn on the third transistor.

21. The method of claim 16 further comprising connecting a predriver control signal to the first common node to making the ESD protection module to function as a driver circuit with the ESD trigger module modified by a diode with its anode connected to the first common node and cathode connected to the gate of the fourth transistor.

* * * * *

UNITED STATES PATENT AND TRADEMARK OFFICE
CERTIFICATE OF CORRECTION

PATENT NO. : 7,242,558 B2  Page 1 of 1
APPLICATION NO. : 10/858798
DATED : July 10, 2007
INVENTOR(S) : Chung-Hui Chen It is certified that error appears in the above-identified patent and that said Letters Patent is hereby corrected as shown below:

Column 6, line 23, delete "tuned" and insert therefore -- turned -- .

Column 6, line 40, delete "node:" and insert therefore -- node; -- .

Column 6, line 45, delete "node." and insert therefore -- node, -- .

Column 7, line 40, delete "transistor:" and insert therefore -- transistor; -- .

Column 7, line 42, delete "node:" and insert therefore -- node; -- .

Column 8, line 30, delete "configured," and insert therefore -- configured -- .

Signed and Sealed this

Twenty-seventh Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,242,558 B2  Page 1 of 1
APPLICATION NO. : 10/858798
DATED : July 10, 2007
INVENTOR(S) : Chung-Hui Chen It is certified that error appears in the above-identified patent and that said Letters Patent is hereby corrected as shown below:

(73) Assignee: Delete "Taiwan Semiconductor Co., Ltd.," and insert therefore -- Taiwan Semiconductor Manufacturing Co., Ltd. --.

Signed and Sealed this

Twenty-fourth Day of November, 2009

David J. Kappos
*Director of the United States Patent and Trademark Office*